(12) United States Patent
Kaga (10) Patent No.: US 7,667,209 B2
(45) Date of Patent: Feb. 23, 2010

(54) FOCUSED ION BEAM APPARATUS

(75) Inventor: Hiroyasu Kaga, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 360 days.

(21) Appl. No.: 11/822,380

(22) Filed: Jul. 5, 2007

(65) Prior Publication Data

US 2008/0067445 A1 Mar. 20, 2008

(30) Foreign Application Priority Data

Jul. 6, 2006 (JP) ............................. 2006-186337

(51) Int. Cl.
*H01J 37/08* (2006.01)
*H01J 37/317* (2006.01)

(52) U.S. Cl. ............. 250/423 R; 250/430; 250/492.21; 250/492.3; 313/363.1; 315/111.31; 315/111.81

(58) Field of Classification Search ............ 250/423 R, 250/430, 492.21, 492.3, 396 R; 313/363.1; 315/111.31, 111.81

See application file for complete search history.

(56) References Cited

U.S. PATENT DOCUMENTS

| | | | | |
|---|---|---|---|---|
| 4,609,809 A | * | 9/1986 | Yamaguchi et al. | .... 219/121.35 |
| 5,825,035 A | * | 10/1998 | Mizumura et al. | ...... 250/423 R |
| 6,459,082 B1 | * | 10/2002 | Sakaguchi | .................. 850/43 |
| 7,189,982 B2 | * | 3/2007 | Madokoro et al. | ..... 250/492.23 |

FOREIGN PATENT DOCUMENTS

JP 10-162769 A 6/1998

* cited by examiner

*Primary Examiner*—Nikita Wells
(74) *Attorney, Agent, or Firm*—Crowell & Moring LLP (57) ABSTRACT

It is an object of the present invention to provide a focused ion beam apparatus capable of prolonging a service life of an aperture, preventing contaminants from increasing when a column valve is closed, and being quickly restarted.

A high-voltage power supply controller lowers an extraction voltage applied to an extraction electrode or lowers a control voltage applied to a control electrode to set an emission to 0 μA when a column valve is closed. The high-voltage power supply controller returns the extraction voltage applied to the extraction electrode to an original extraction voltage or returns the control voltage applied to the control electrode to an original control voltage when a column valve is opened.

12 Claims, 4 Drawing Sheets

FOCUSED ION BEAM APPARATUS

BACKGROUND OF THE INVENTION

1. Field of the Invention

The present invention relates to a focused ion beam apparatus irradiating a sample with a thinned ion beam and performing a microfabrication processing on the sample, in particular to a focused ion beam apparatus having a column valve.

2. Description of the Related Art

As a focused ion beam apparatus that irradiates a sample with a thinned ion beam and that performs a microfabrication processing on the sample, there is conventionally known an apparatus disclosed in, for example, Japanese Patent Application Laid-Open No. 10-162769.

In the focused ion beam apparatus disclosed therein, processing accuracy (accuracy in finished shape) depends on a thinness of an ion beam, i.e., a magnitude of a beam spot on the sample, and a throughput (processing speed) depends on a current amount of the beam. To perform high accuracy and high throughput processing, it is necessary to use an ion beam as thin as possible and to use high electric current.

The focused ion beam apparatus includes an aperture device configured to include openings (apertures) of various sizes so as to be able to produce beams of various current amounts and to be able to locate an aperture of a desired size onto a central axis of an optical system. Namely, a higher-current beam can be obtained by employing a larger aperture. However, a charged-particle-beam-applied apparatus has the following characteristics. If a larger aperture is employed, a beam spot becomes larger because of lens aberration of the optical system that focuses a charged particle beam on the sample. As a result, it is disadvantageously impossible to process the sample with high accuracy. On the other hand, if an aperture having a smaller diameter with low aberration is employed, a beam spot can be made smaller. However, beam current is lower, so that the throughput is disadvantageously deteriorated.

Considering these disadvantages, the sample is processed by executing a plurality of steps using a high-current beam or a microbeam depending upon circumstances so as to process the sample with as high accuracy as possible and as high throughput as possible. First, an entire processing region of the sample is processed (subjected to rough processing) with low accuracy by a high-current beam obtained by using the larger aperture. A region near a boundary of the processing region is processed (subjected to intermediate processing) by a beam having a beam spot of an intermediate size and an intermediate amount of current. Further, a narrow region on the boundary is finished (subjected to finishing processing) with high accuracy by a microbeam obtained by using the smaller aperture.

Examples of ion beams used in the processings in these steps include an ion beam for rough processing with a current amount of 30 nA and a beam spot diameter of one μm obtained by using an aperture at a diameter of 650 μm, an ion beam for intermediate processing with a current amount of six nA and a beam spot diameter of 0.15 μm obtained by using an aperture at a diameter of 300 μm, and an ion beam for finishing processing with a current amount of 0.1 nA and a beam spot diameter of 0.02 μm obtained by using an aperture at a diameter of 40 μm.

Moreover, the focused ion beam apparatus normally includes a column valve arranged between an ion gun and a sample chamber. The column valve is a valve for evacuation. In a state in which the column valve is closed, even if the sample chamber is in an atmospheric pressure environment, the ion gun can be kept to have a degree of vacuum of about $10^{-6}$ Pa. If the focused ion beam apparatus is left for a long time or the sample is replaced by another sample, the column valve is closed for safety against unexpected vacuum leakage.

However, as long as emission from an ion source provided in the focused ion beam apparatus continues, the aperture is constantly irradiated with the ion beam. Due to this, the ion beam passed through one of the apertures is restricted and cut off. Since the ion beam is heavier by $10^3$ to $10^4$ than an electron beam, the ion beam has a sputtering action. When members constituting the apertures are subjected to sputtering by irradiation of the ion beam, surfaces of the members and sidewalls of openings of the apertures are shaved. The surfaces of the members and the sidewalls of openings of the apertures become thinner and the openings of the apertures become wider. As a result, a diameter of each aperture increases, and a desired current amount and a desired diameter of the beam cannot be obtained. This disadvantageously deteriorates a performance of the focused ion beam apparatus as the charged-particle beam irradiation apparatus. To bring the apparatus back into good performance, replacement of the apertures is necessary. Namely, a service life of an aperture ends when the replacement time has comes. The service life of the aperture generally depends on an irradiation amount (irradiation current density×irradiation time) of the beam accumulated per unit area.

An index of a beam performance for evaluating high processing accuracy and high throughput in microfabrication using the ion beam is a current density of the beam. Assuming ion beams having the same beam spot diameter for comparison, the higher-current beam is irradiated when the current density of the beam is higher. Therefore, the sample can be processed at higher speed with the same processing accuracy. In the above-stated example of the ion beams, current densities of the beam for rough processing, the beam for intermediate processing, and the beam for finishing processing on the beam spot are 3.8 A/cm$^2$, 34 A/cm$^2$, and 31.8 A/cm$^2$, respectively. The current density of the beam for rough processing is far lower than those of the beam for intermediate processing and the beam for finishing processing.

If a TEM sample is to be produced using a focused ion beam, it takes time to finish the sample into a thin film. It is, therefore, desired to make the current density of the finishing beam further higher.

Development of an ion-beam-applied microfabrication processing apparatus capable of generating an ion beam at high current density in an entire range of the beam used for microfabrication processing is underway, and the current density of the beam is increasingly higher. Due to this, the ion beam irradiated onto the aperture of the aperture device is concentrated on a narrow irradiation region and the current density of the beam becomes higher. An irradiation amount (irradiation current density×irradiation time) of the beam accumulated per unit area is an indication for determining whether a service life of each aperture expires. A time required until such an irradiation amount reaches an upper limit (time until an irradiated region is thinner and an opening diameter of the aperture begins to change) is disadvantageously shortened.

Moreover, in the focused ion beam apparatus including the column valve, if the ion beam is emitted from the ion source when the column valve is closed, then the column valve is irradiated with the beam, and sputtering particles and secondary electrons are generated. The sputtering particles and secondary electrons collide against a surface wall of a vacuum container in which the column valve is disposed. Absorbable molecules such as hydrocarbons on the surface wall are decomposed and solidified, and deposited to form a high resistance or insulating film. In this way, contaminants disadvantageously increase. To prevent the disadvantage, a high-voltage power supply may be turned off when the column valve is closed. It is thereby possible to prevent emission of the ion beam. However, if the high-voltage power supply is turned on again, it takes some time until emission is stabilized. Due to this, it disadvantageously takes long time to restart the apparatus.

SUMMARY OF THE INVENTION

It is an object of the present invention to provide a focused ion beam apparatus capable of prolonging a service life of an aperture, preventing contaminants from increasing when a column valve is closed, and being quickly restarted.

The present invention is related to controlling an extraction voltage applied to an extraction electrode, a control voltage applied to a control electrode or a voltage applied to a condenser electrode according to an operation for opening or closing a column valve.

The present invention is related to lowering an extraction voltage applied to an extraction electrode or a control voltage applied to a control electrode is lowered to set an emission current to 0 μA, or a voltage applied to a condenser electrode to widen a beam diameter of the ion beam. Preferably, the extraction voltage applied to the extraction electrode or the voltage applied to the condenser electrode is returned to an original voltage.

According to the present invention, the ion beam can be emitted at appropriate time if needed. Therefore, it is possible to prolong service lives of an ion source and apertures, to prevent contaminants from increasing even when the column valve is closed, and to quickly restart the apparatus.

DESCRIPTION OF THE PREFERRED EMBODIMENTS

The above and other novel features and effects of the present invention will be described hereinafter with reference to the accompanying drawings. It is to be noted that the drawings are referred to only for illustrative purposes and are not intended to limit the scope of the invention.

First Embodiment

Figure 1:
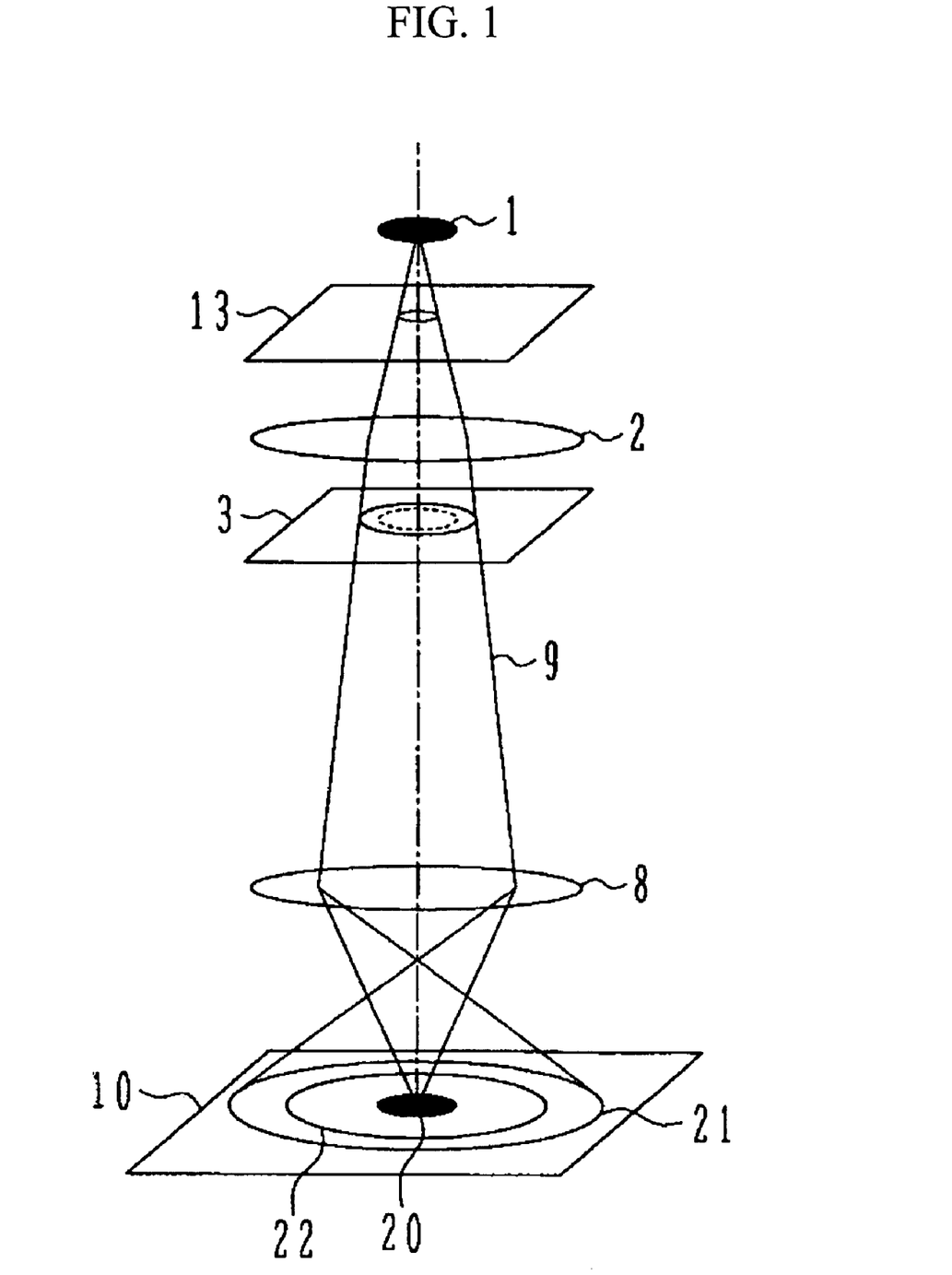
FIG. 1 is a schematic diagram explaining an optical system of a focused ion beam apparatus according to a first embodiment of the present invention.

Referring to FIGS. 1 to 5, a configuration of a focused ion beam apparatus according to a first embodiment of the present invention will be described. First, referring to FIG. 1, an optical system of the focused ion beam apparatus according to the first embodiment will be described. FIG. 1 is a schematic diagram explaining the optical system of the focused ion beam apparatus according to the first embodiment.

The reason that high throughput processing can be realized by selecting opening diameters of apertures and lens operating conditions to be used at a step of positioning a sample to be processed, a step for rough processing, a step for intermediate processing, and a step for finishing processing, respectively in an ion-beam microfabrication processing method will be described. Namely, the reason that there are optimum combinations of aperture diameters and lens operating conditions, depending on purposes of use of an ion beam will be described.

FIG. 1 shows a state in which an ion beam is produced by an ion beam irradiation apparatus. A beam spot on a sample 10 resulting from an ion beam 9 is formed by a method of projecting an image of an ion source 1 onto the sample 10 using an optical system configured to include a condenser lens 2 and an objective lens 8. If a focusing magnification of the optical system is lower, then smaller image 20 of the ion source 1 is projected onto the sample 10 and a smaller beam spot is formed on the sample 10. A thin ion beam for a small beam spot is suited for the step of positioning the sample 10 to be processed.

On the other hand, it is necessary to use a higher-current beam so as to improve throughput for processing. Due to this, an aperture 3 having a large diameter is used. However, if the diameter of the aperture 3 is larger, then a diameter of the ion beam increases due to lens aberration, and a widened beam spot 21 is formed on the sample 10. However, a magnitude of the ion source image 20 projected onto the sample 10 remains unchanged. In the state shown in FIG. 1, a magnitude of the beam sport on the sample 10 depends on the lens aberration.

According to the principle of the brightness conservation law of the optical system, if the focusing magnification is higher, a higher-current beam can be obtained. According to the principle, if the current amount is increased by using a larger-diameter aperture, the diameter of the ion beam is already increased by the aberration. Due to this, even if the image of the ion source 1 is projected so that the projected image has a magnitude close to that of image 22 shown in FIG. 1 at a slightly higher focusing magnification, a higher beam current should be obtained without need to greatly increase the beam diameter. If the focusing magnification is set further higher, the current amount increases, accordingly. In this case, the ion source image is excessively large relative to the aberration, with the result that the diameter of the beam spot on the sample 10 becomes excessively large.

An ion beam which generates a relatively small beam spot diameter and the current of which is high is a thin ion beam having a high current density. Such an ion beam is formed at an focusing magnification so that a balance is kept between the spread of the ion beam 9 by the aberration and the magnitude of the ion image. This optimum focusing magnification can be calculated based on the magnitude of the aperture and that of the ion source. Further, if the optimum focusing magnification is determined, the lens operating conditions (a voltage applied to the lenses or an excitation current therefor) necessary to form an ion beam at the optimum magnification can be obtained by calculation.

To produce an ion beam having a further large current amount, a further larger-diameter aperture is employed. In this case, the aberration becomes greater. Accordingly, an optimum magnification for the optical system to this aperture is further increased. Namely, the ion beam processing apparatus has an optimum combination of aperture diameter and focusing magnification for the positioning processing, the rough processing, the intermediate processing, and the finishing processing, respectively. By performing operations using the respective combinations, it is possible to process the sample 10 efficiently. Namely, it is possible to perform the positioning processing with high accuracy using a thinner beam and to process the sample 10 using a beam having a high current density with a high throughput.

In FIG. 1, reference numeral 13 denotes a baffle between the ion gun and the lens.

Figure 2:
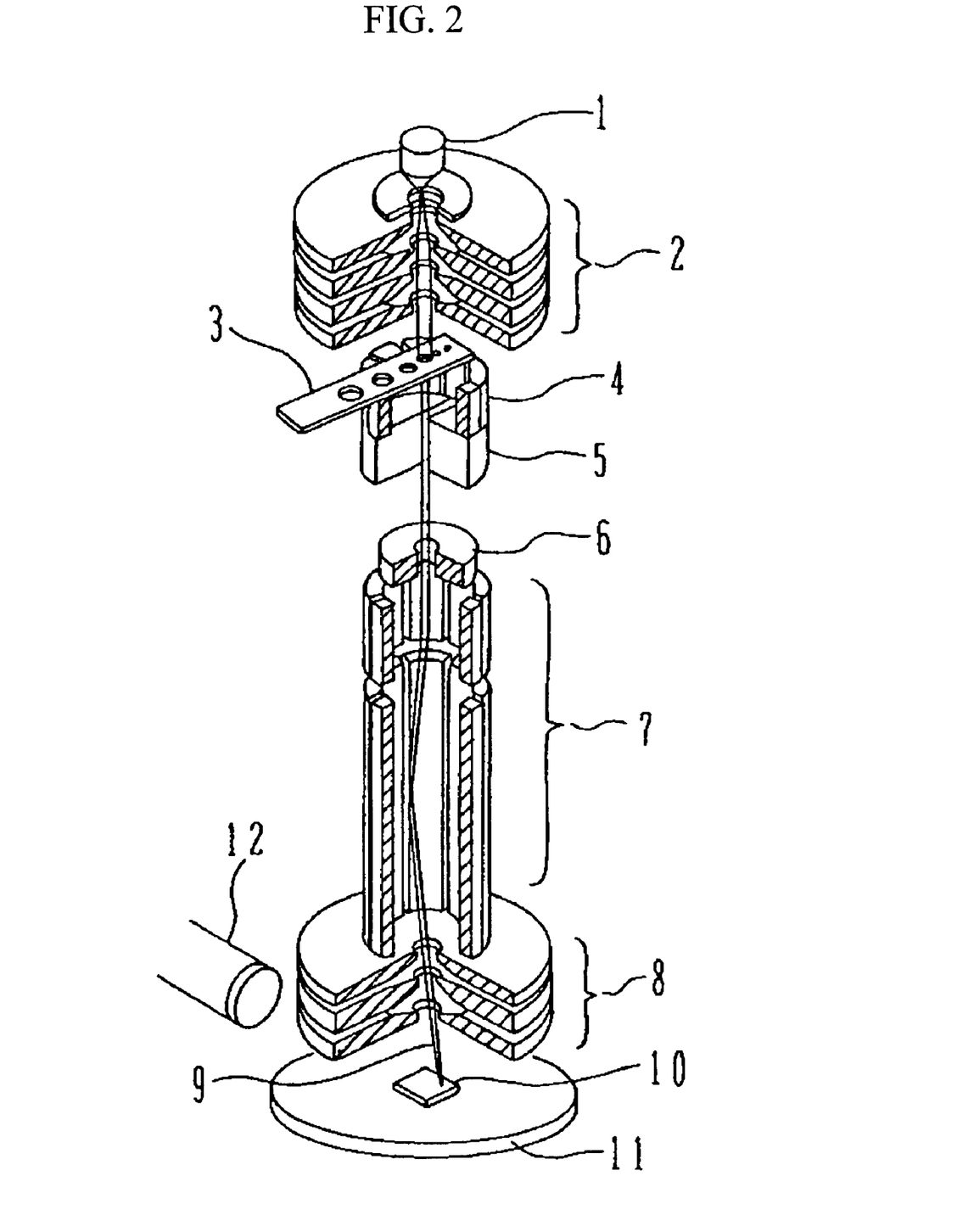
FIG. 2 is a partial cross-sectional perspective view showing a configuration of the focused ion beam apparatus according to the first embodiment of the present invention.
Figure 3:
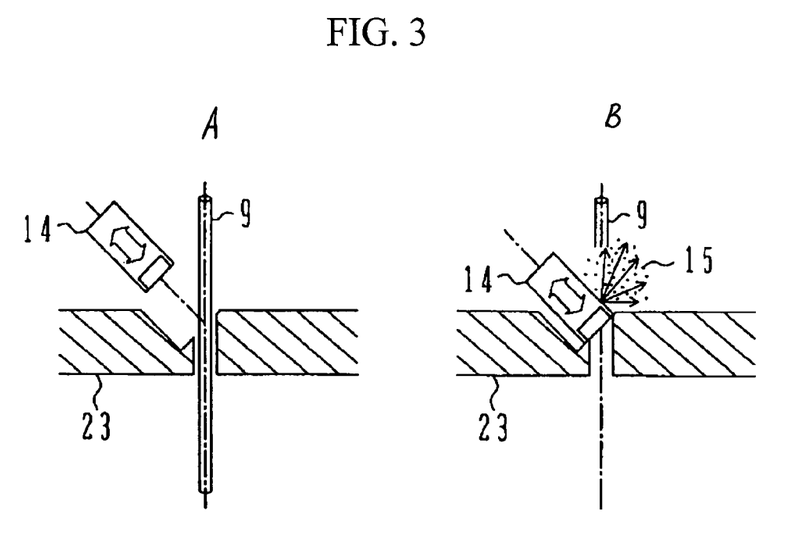
FIGS. 3A and 3B are cross-sectional views of relevant parts showing a configuration of a column valve employed in the focused ion beam apparatus according to the first embodiment of the present invention.

Referring next to FIG. 2, a configuration of the focused ion beam apparatus according to the first embodiment will be described. FIG. 2 shows an example in which the focused ion beam apparatus is applied to an ion beam processing apparatus.

FIG. 2 is a partial cross-sectional perspective view showing the configuration of the focused ion beam apparatus according to the first embodiment of the present invention.

The ion beam 9 irradiated from the ion source 1 is influenced by a weak focusing function of the condenser lens 2 and is irradiated on an aperture device 3. The aperture device 3 includes four apertures at diameters of, for example, 5 μm, 40 μm, 300 μm, and 650 μm, respectively, and is moved sideways by an aperture moving device. Therefore, a preferable aperture can be located on a central axis of the focused ion beam apparatus. The ion beam 9 passed through the aperture of the aperture device 3 enters the objective lens 8 via an aligner/stigma 4, a blanker 5, a blanking plate 6, and a beam scanner 7. The ion beam 9 is thinned by the objective lens 8 and irradiated onto the sample 10 mounted on a sample stage 11. An ion beam irradiation position on the sample 10 is controlled by the beam scanner 7. A signal generated by irradiation of the ion beam 9 on the sample 10 is detected by a detector 12 and synchronized with an operation signal transmitted from the beam scanner 7, thereby displaying an image on a screen.

The magnitude of the ion beam 9 obtained by each of the apertures of the aperture device 3 is controlled so that the beam 9 has a highest current density for each aperture. If the aperture having the diameter of 5 μm is employed, the ion beam 9 having a beam current of 1 pA and a beam diameter of 6 nmΦ is obtained. If the aperture having the diameter of 40 μm is employed, the beam 9 having a beam current of 0.2 μA and a beam diameter of 30 nmΦ is obtained. If the aperture having the diameter of 300 μm is employed, the beam 9 having a beam current of 20 nA, a beam diameter of 0.25 μm, and a current density of 60 A/cm$^2$ is obtained. If the aperture having the diameter of 520 μm is employed, the beam 9 having a beam current of 60 nA, a beam diameter of 1 μm, and a current density of 7.6 A/cm$^2$ is obtained.

Referring to FIG. 2, the positional relation among the constituent elements of the focused ion beam apparatus will be described. To form an ion beam of a high current density, it is necessary to arrange the extraction condenser lens 2 as close to the ion source 1 as possible. Further, if the beam restricted by one of the apertures of the aperture device 3 is not deflected, deflection aberration has great effect on the beam. Due to this, the aperture (objective aperture) of the aperture device 3 is arranged in front of a deflector. The objective lens 8 needs to be disposed away from the ion source 1 so as to get a high resolution, and an image reduction ratio needs to be set higher. The blanking plate (Faraday cup) 6 needs to be arranged downstream of the blanker 5 (hereinafter, an ion source side and a sample side will be referred to as "upstream" and "downstream", respectively in the positional relation) and downstream of the apertures of the aperture device 3 so as to measure the current of the ion beam used for processing. In this positional relation, a column valve is arranged between the apertures of the aperture device 3 and the objective lens 8 so as to keep degrees of vacuum of the respective constituent elements. In FIG. 2, the column valve is disposed just upstream of the blanking plate (Faraday cup) 6.

In the focused ion beam apparatus, it is not necessary to always irradiate the sample 10 with the ion beam 9 during the observation of processing but necessary to cut off the beam 9 appropriately while no processing is performed. Unless the beam 9 is cut off, the sample 10 is always irradiated on the beam 9 to excessively process the sample 10. Due to this, the beam 9 is deflected by the blanker 5 and captured by the blanking plate 6.

Referring to FIGS. 3A and 3B, a configuration of the column valve employed in the focused ion beam apparatus according to the first embodiment will be described.

FIGS. 3A and 3B are cross-sectional views of relevant parts showing the configuration of the column valve employed in the focused ion beam apparatus according to the first embodiment of the present invention. In FIGS. 3A and 3B, the same reference numerals as those shown in FIG. 1 denote the same constituent elements.

A baffle 23 is arranged between an ion gun and a sample chamber. A column valve 14 is provided near the baffle 23. As shown in FIG. 3A, in a state in which the column valve 14 is opened, the ion beam 9 is introduced into the sample chamber through an opening formed in the baffle 13 to perform a microfabrication processing on the sample.

After finishing the processing on the sample, the column valve 14 is closed if needed as shown in FIG. 3B. The column valve 14 is a valve for evacuation. In a state in which the column valve 14 is closed, even if the sample chamber is in an atmospheric pressure environment, the ion gun can be kept to have a degree of vacuum of about 10$^{-6}$ Pa.

When the column valve 14 is closed, the column valve 14 produces a vacuum in the form of blocking a passage of the ion beam 9. Therefore, if the column valve 14 is closed, then the beam 9 is irradiated onto the column valve 14 and sputtering particles and secondary electrons 15 are generated during emission of the ion beam 9. The sputtering particles and secondary electrons 15 collide against a surface wall of a vacuum container in which the column valve 14 is disposed. Further, absorbable molecules such as hydrocarbons on the surface wall are decomposed, solidified, and deposited on the surface wall, thereby generating contaminants on the surface wall. Such contaminants accelerate a beam drift, with the result that a processing position is misaligned and the beam cannot be narrowed. Besides, even in the state in which the column valve 14 is closed, the beam 9 is irradiated onto one of the apertures of the aperture device 3. As a result, the aperture is subjected to sputtering to be consumed, and a replacement cycle of the aperture is shortened. To avoid the disadvantages, a method of turning off a high-voltage power supply in conjunction with an operation for closing the column valve 14 may be considered. With the method, it takes long time to restart the high-voltage power supply to deteriorate user-friendliness of the apparatus.

In the first embodiment, the ion beam 9 is cut off without turning off the high-voltage power supply when the column valve 14 is closed. When the column valve 14 is opened, the beam 9 is irradiated as long as the high-voltage power supply is turned on. In this way, the ion beam 9 is cut off without turning off the high-voltage power supply, whereby the contaminants can be reduced. Further, if the ion beam 9 changes from an emission-OFF state to an emission-ON state, it is possible to return the ion beam 9 to an original emission state with high reproducibility.

Figure 4:
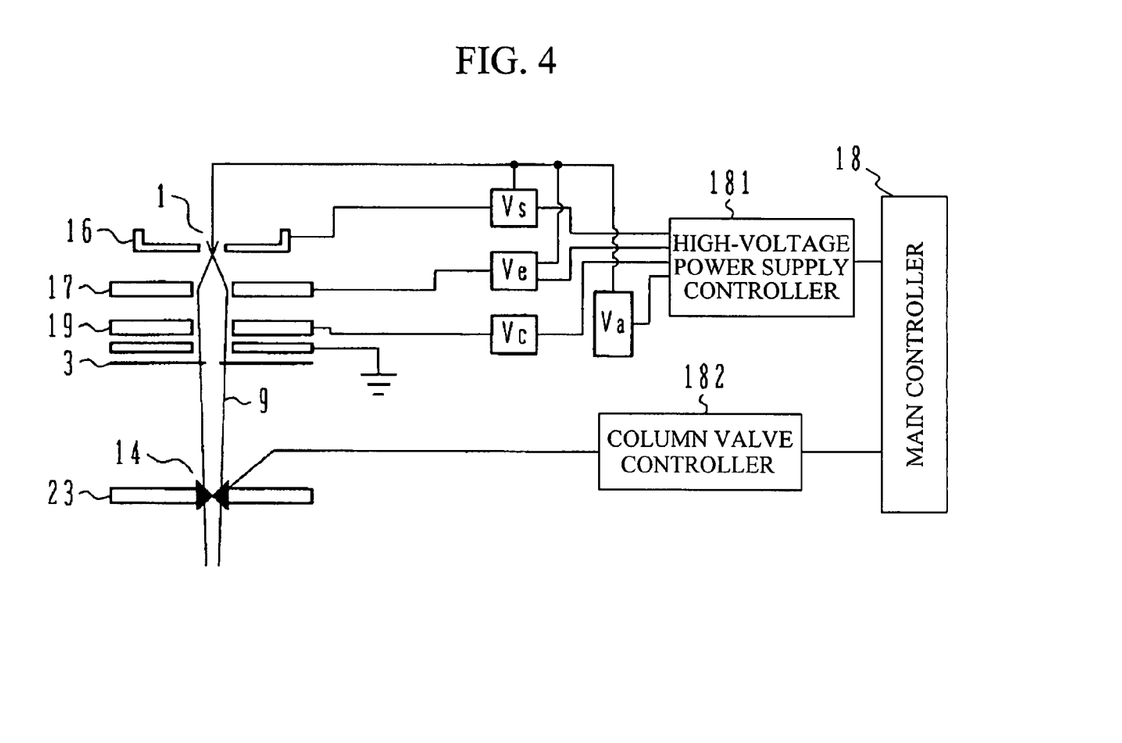
FIG. 4 is a system block diagram of the focused ion beam apparatus according to the first embodiment of the present invention.
Figure 5:
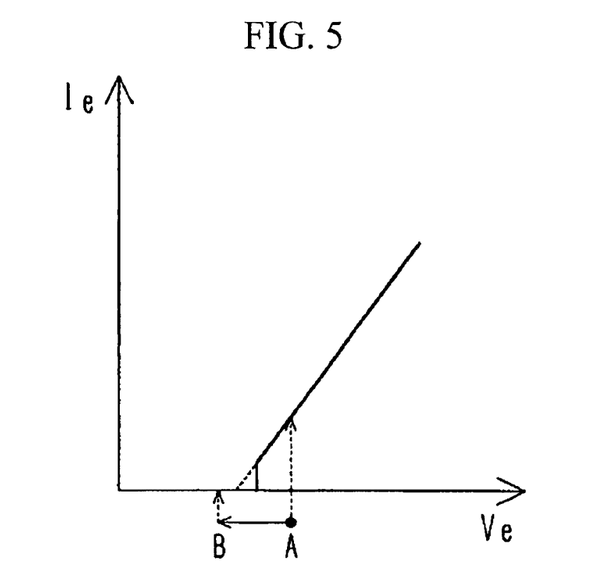
FIG. 5 is a graph showing a control operation performed by the focused ion beam apparatus according to the first embodiment of the present invention.

Referring to FIGS. 4 and 5, a system configuration of the focused ion beam apparatus according to the first embodiment will be described.

FIG. 4 is the system block diagram of the focused ion beam apparatus according to the first embodiment of the present invention. FIG. 5 is a graph showing a control operation performed by the focused ion beam apparatus according to the first embodiment of the present invention. In FIG. 4, the same reference numerals as those shown in FIGS. 1 to 3 denote the same constituent elements.

As shown in FIG. 4, an extraction electrode 17 extracting emission of the ion beam 9 from the ion source 1, a control electrode 16 controlling the emission of the ion beam 9 to be constant, and a condenser electrode 19 are provided at the ion source 1. The aperture 3 that restricts the ion beam 9 and the column valve 14 arranged on the baffle 14 are provided downstream of the ion source 1.

Power is supplied from an extraction power supply Ve to the extraction electrode 17 extracting the emission of the ion beam 9 from the ion source 1. Power is supplied from a control electrode power supply Vs to the control electrode 16 controlling the emission of the ion beam 9 to be constant. Moreover, a power supply Va accelerating the emission of the ion beam 9 and a control power supply Vc supplying power to the condenser electrode 19 are provided.

A high-voltage power supply controller 181 controls the high-voltage power supplies Vs, Ve, Va, and Vc. A column valve controller 182 controls the column valve 14 to be opened or closed. A main controller 18 controls entirety of the focused ion beam apparatus including the high-voltage power supply controller 181 and the column valve controller 182.

The column valve controller 182 controls the column valve 14 to be closed based on a command to close the column valve 14 from the controller 18. When the column valve 14 is closed, the controller 18 outputs a command to set the emission to 0 μA to the high-voltage power supply controller 181. The high-voltage power supply controller 181 lowers a voltage of the extraction power supply Ve to thereby cut off the ion beam 9 without turning off the high-voltage power supply.

Referring now to FIG. 5, Ie/Ve characteristic (emission current change characteristic relative to voltage change) will be described as an index of emission characteristic of a liquid metal ion source (LMIS).

The Ie/Ve characteristic of a Ga LMIS is typically about 0.1 μA/V (Ie/Ve≅0.1 μA/V). Accordingly, if the extraction voltage (about 8 kV) is changed in a range between −50 V and 50 V, the emission changes in a range between −5 μA and 5 μA. The emission current is assumed to be 2.4 μA when the extraction voltage is A. In this case, if the extraction voltage is lowered by 50 V, the emission becomes 0 μA and the ion beam is cut off. If the ion beam is to be irradiated, the extraction voltage is raised by 50 V, whereby the emission current becomes 2.4 μA as before cutting off the beam. The Ga LMIS has no change in the Ie/Ve characteristic while a Ga surface thereof is not contaminated by oxidation, secondary electron irradiation or the like while the emission of the ion gun is stopped. The degree of vacuum of the ion gun is about $10^{-6}$ Pa, and the sputtering particles and secondary electrons are not generated in a non-emission state. Due to this, if the extraction voltage is returned to an original extraction voltage, the ion beam turns into an original emission state with high reproducibility. It is thereby possible to smoothly change the state from a dormant state to an execution state without waiting time for returning the ion beam to its original emission state, even in a case of turning on the high-voltage power supply after turning it off. It is to be noted, however, that a control voltage of ±50 V changes according to the configuration of the LMIS and that of the power supply for extracting the emission of the ion beam from the LMIS. For example, it is assumed that the extraction power supply includes a resistance R of 300 MΩ as a bias resistance R. If the emission current Ie is 3.2 μA at an extraction voltage Vext of 8 kV, the extraction voltage Ve actually applied to the LMIS is Vext−R×Ie=7.04 kV (Ve=Vext−R×Ie=7.04 kV). In this case, if the extraction voltage is lowered by 1 kV to set the emission to 0, the extraction voltage Ve is 7 kV (Ve=7 kV). Therefore, an actual change in the extraction voltage is 40 V. In this sense, apparent control voltage depends on the apparatus to be used.

Whether the ion beam 9 is kept to be irradiated or cut off after finishing the processing can be selected on a control screen. If the apparatus is not used for a while after finishing the processing, "close column valve" is selected on the control screen. If the apparatus is used soon after finishing the processing, "close column valve" is not selected. If "cut off beam" is selected, the column valve 14 is closed after finishing the processing. In conjunction with the closure of the column valve 14, the emission of the ion beam 9 from the ion source 1 is controlled.

Moreover, a constant voltage (e.g., +50 V) may be applied to the emission extraction-related electrode (the extraction electrode or the emission control electrode) to lower the extraction voltage and to set the emission to 0 μA. It is thereby possible to suppress an irradiation amount of the ion beam accumulated in the aperture, to return the extraction voltage to the original extraction voltage when the ion beam is necessary to irradiate to return the beam into the original state, and to prolong the service life of the aperture. If the service life of the aperture is concerned, the emission can be set to 0 μA without regard to conjunction with the column valve 14.

As stated so far, according to the first embodiment, the voltage of the extraction power supply Ve is lowered in conjunction with the closure of the column valve 14, and the ion beam can be cut off without turning off the high-voltage power supply. It is thereby possible to suppress the irradiation amount of the ion beam accumulated in the aperture and to prolong the service life of the aperture.

Second Embodiment

Figure 6:
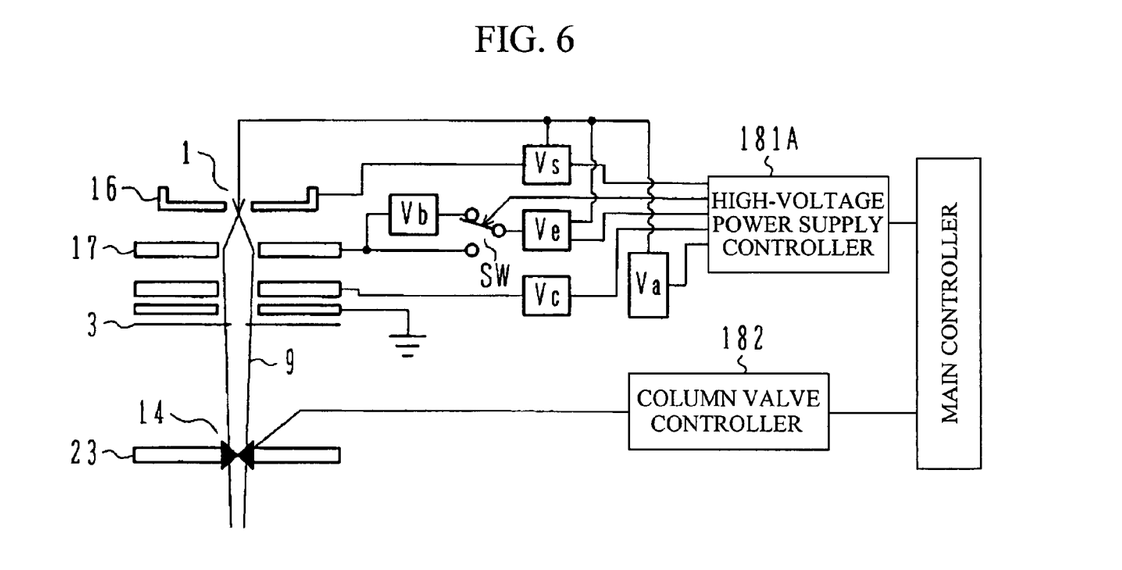
FIG. 6 is a system block diagram of a focused ion beam apparatus according to a second embodiment of the present invention.

Referring to FIG. 6, a system configuration of a focused ion beam apparatus according to a second embodiment of the present invention will be described. An optical system of the focused ion beam apparatus according to the second embodiment is the same as that shown in FIG. 1. A configuration of the focused ion beam apparatus according to the second embodiment is the same as that shown in FIG. 2. Further, a configuration of a column valve employed in the focused ion beam apparatus according to the second embodiment is the same as that shown in FIG. 3.

FIG. 6 is a system block diagram of the focused ion beam apparatus according to the second embodiment of the present invention. In FIG. 6, the same reference numerals as those shown in FIG. 5 denote the same constituent elements.

The focused ion beam apparatus according to the second embodiment is configured to include a bias power supply VB and switching means SW in addition to the constituent elements shown in FIG. 4. The bias power supply VB is a power supply that supplies a constant voltage of, for example, −50 V. A high-voltage power supply controller 181A controls the switching means SW to switch over between connection of the bias power supply VB to the extraction power supply Ve in series and disconnection of the bias power supply VB from the extraction power supply Ve.

If a column valve controller 182 controls the column valve 14 to be closed based on a command to close the column valve 14 output from the controller 18, the controller 18 outputs a command to set the emission to 0 μA to the high-voltage power supply controller 181A. The high-voltage power supply controller 181A controls the switching means SW to connect the bias power supply VB to the extraction power supply Ve in series to lower the voltage of the extraction power supply Ve and to set the emission to 0 μA. The ion beam 9 is thereby cut off without turning off the high-voltage power supply.

When the column valve 14 is opened, the high-voltage power supply controller 181A controls the switching means SW to disconnect the bias power supply VB from the extraction power supply Ve, thereby making it possible to apply an original extraction voltage to the extraction electrode 17. It is, therefore, possible to accurately return the ion beam 9 to the original emission state.

The bias voltage supplied from the bias power supply VB is set to a voltage of about −50 V relative to an emission start voltage (a threshold voltage of about 8 kV) of the LMIS. The bias power supply is floated on the extraction power supply Ve to superimpose the bias voltage on the extraction voltage without basically changing an acceleration voltage and the extraction voltage. The resultant voltage is applied to the extraction electrode 17, thus controlling the extraction voltage.

While the bias voltage is set to a rated voltage of −50 V, the bias voltage may be variably controlled. However, the Ga LMIS has no change in Ie/Ve characteristic as long as the Ga surface is not contaminated by oxidation, secondary electron irradiation or the like while the emission of the ion beam 9 is stopped. The degree of vacuum of the ion gun is about $10^{-6}$ Pa, and the secondary electrons are not generated in a non-emission state with the bias voltage applied to the extraction electrode 17. Due to this, if the bias voltage is set to 0, the ion beam 9 turns into the original emission state with high reproducibility. For the reason, the bias voltage may be basically set to the rated bias voltage.

According to the second embodiment, the bias voltage is applied to the extraction voltage of the extraction power supply Ve in conjunction with the closure of the column valve, and the ion beam 9 can be cut off without turning off the high-voltage power supply. It is thereby possible to suppress the irradiation amount of the ion beam 9 accumulated in the aperture and to prolong the service life of the aperture.

Further, it is possible to accurately return the ion beam 9 to the original emission state by not applying the bias voltage.

Third Embodiment

Referring to FIG. 4, a system configuration of a focused ion beam apparatus according to a third embodiment of the present invention will be described. An optical system of the focused ion beam apparatus according to the third embodiment is the same as that shown in FIG. 1. A configuration of the focused ion beam apparatus according to the third embodiment is the same as that shown in FIG. 2. Further, a configuration of a column valve employed in the focused ion beam apparatus according to the third embodiment is the same as that shown in FIG. 3.

In the first embodiment shown in FIG. 4, the beam is cut off without turning off the high-voltage power supply by lowering the extraction voltage Ve to set the emission to 0 μA. In the third embodiment, by contrast, the high-voltage power supply controller 181 lowers the control voltage Vs to set the emission to 0 μA, thereby cutting off the beam without turning off the high-voltage power supply.

At this time, as described with reference to FIG. 6, the bias voltage from the bias power supply may be superimposed on the control voltage Vs.

According to the third embodiment, the ion beam 9 can be cut off without turning off the high-voltage power supply. Therefore, it is possible to suppress the irradiation amount of the ion beam accumulated in the aperture and to prolong the service life of the aperture.

Fourth Embodiment

Referring to FIG. 4, a system configuration of a focused ion beam apparatus according to a fourth embodiment of the present invention will be described. An optical system of the focused ion beam apparatus according to the fourth embodiment is the same as that shown in FIG. 1. A configuration of the focused ion beam apparatus according to the fourth embodiment is the same as that shown in FIG. 2. Further, a configuration of a column valve employed in the focused ion beam apparatus according to the fourth embodiment is the same as that shown in FIG. 3.

In the embodiment shown in FIG. 4, the ion beam 9 is cut off without turning off the high-voltage power supply by lowering the extraction voltage Ve to set the emission to 0 μA. In the fourth embodiment, by contrast, the high-voltage power supply controller 181 lowers the condenser voltage Vc. By lowering the condenser voltage Vc, the diameter of the ion beam 9 widens and the irradiation amount of the ion beam 9 per unit area of the aperture is reduced. The service life of the aperture can be, therefore, prolonged.

At this time, as described with reference to FIG. 6, the bias voltage from the bias power supply may be superimposed on the condenser voltage Vc.

According to the fourth embodiment, it is possible to suppress the irradiation amount of the ion beam 9 accumulated in the aperture and to prolong the service life of the aperture.

What is claimed is:

1. A focused ion beam apparatus comprising:
   an ion source;
   an extraction electrode for extracting an ion beam emission from the ion source;
   a lens for focusing the ion beam extracted from the ion source by the extraction electrode;
   a condenser electrode which forms the lens;
   an aperture for restricting a beam current of the ion beam;
   a column valve for holding a degree of vacuum; and
   control means for controlling an extraction voltage applied to the extraction electrode according to an operation for opening or closing the column valve.

2. The focused ion beam apparatus according to claim 1, wherein the control means lowers the extraction voltage applied to the extraction electrode when the column valve is closed, and returns the extraction voltage applied to the extraction electrode to an original voltage when the column valve is opened.

3. The focused ion beam apparatus according to claim 2, further comprising a bias power supply for generating a bias voltage,
   wherein the control means connects the bias power supply to the extraction electrode when the column valve is closed, and disconnects the bias power supply from the extraction electrode when the column valve is opened.

4. A focused ion beam apparatus comprising:
an ion source;
an extraction electrode for extracting an ion beam emission from the ion source;
a lens for focusing the ion beam extracted from the ion source by the extraction electrode;
a condenser electrode which forms the lens;
an aperture for restricting a beam current of the ion beam;
a column valve for holding a degree of vacuum; and
control means for controlling a voltage applied to the condenser electrode according to an operation for opening or closing the column valve.

5. The focused ion beam apparatus according to claim 4, wherein the control means lowers the voltage applied to the condenser electrode when the column valve is closed, and returns the voltage applied to the condenser electrode to an original voltage when the column valve is opened.

6. The focused ion beam apparatus according to claim 5, further comprising a bias power supply for generating a bias voltage,
wherein the control means connects the bias power supply to the condenser electrode when the column valve is closed, and disconnects the bias power supply from the condenser electrode when the column valve is opened.

7. A focused ion beam apparatus comprising:
an ion source;
a control electrode for controlling an ion beam emission extracted from the ion source to be constant;
a lens for focusing the ion beam extracted from the ion source by the extraction electrode and the control electrode;
a condenser electrode which forms the lens;
an aperture for restricting a beam current of the ion beam;
a column valve for holding a degree of vacuum; and
control means for controlling a control voltage applied to the control electrode according to an operation for opening or closing the column valve.

8. The focused ion beam apparatus according to claim 7, wherein the control means lowers the control voltage applied to the control electrode when the column valve is closed, and returns the control voltage applied to the control electrode to an original voltage when the column valve is opened.

9. The focused ion beam apparatus according to claim 8, further comprising a bias power supply for generating a bias voltage,
wherein the control means connects the bias power supply to the control electrode when the column valve is closed, and disconnects the bias power supply from the control electrode when the column valve is opened.

10. A focused ion beam apparatus comprising:
an ion source;
a control electrode for controlling an ion beam emission extracted from the ion source to be constant;
a lens for focusing the ion beam extracted from the ion source by the extraction electrode and the control electrode;
a condenser electrode which forms the lens;
an aperture for restricting a beam current of the ion beam;
a column valve for holding a degree of vacuum; and
control means for controlling a voltage applied to the condenser electrode according to an operation for opening or closing the column valve.

11. The focused ion beam apparatus according to claim 10, wherein the control means lowers the voltage applied to the condenser electrode when the column valve is closed, and returns the voltage applied to the condenser electrode to an original voltage when the column valve is opened.

12. The focused ion beam apparatus according to claim 11, further comprising a bias power supply for generating a bias voltage,
wherein the control means connects the bias power supply to the condenser electrode when the column valve is closed, and disconnects the bias power supply from the condenser electrode when the column valve is opened.

* * * * *